United States Patent [19]

Du Pont et al.

[11] Patent Number: 4,592,925
[45] Date of Patent: Jun. 3, 1986

[54] POLYIMIDE COMPOSITION AND METHOD FOR PROTECTING PHOTOREACTIVE CELLS

[75] Inventors: Preston S. Du Pont, Northridge; Norman Bilow, Encino, both of Calif.

[73] Assignee: Hughes Aircraft Company, Los Angeles, Calif.

[21] Appl. No.: 693,024

[22] Filed: Jan. 18, 1985

Related U.S. Application Data

[62] Division of Ser. No. 451,137, Dec. 20, 1982, abandoned.

[51] Int. Cl.$^4$ .......................................... H01L 21/312
[52] U.S. Cl. ........................................ 427/74; 427/160
[58] Field of Search ................................ 427/74, 160

[56] References Cited

U.S. PATENT DOCUMENTS 3,356,648  12/1967  Rogers ............................... 528/353

FOREIGN PATENT DOCUMENTS 2536350  2/1977  Fed. Rep. of Germany ........ 427/74

Primary Examiner—James R. Hoffman
Attorney, Agent, or Firm—M. E. Lachman; A. W. Karambelas

[57] ABSTRACT

A protective coating for solar cells, particularly solar cells positioned in space and which coating is a polyimide which is colorless, transparent, relatively non-brittle, has a high degree of thermal stability and readily transmits solar radiation without appreciable degradation. The coating is heat resistant and does not degrade significantly when exposed to ultraviolet radiation, and is highly effective in repelling low energy proton particles. In a preferred embodiment, the protective polyimide coating is a polymer having the following recurring structural unit:

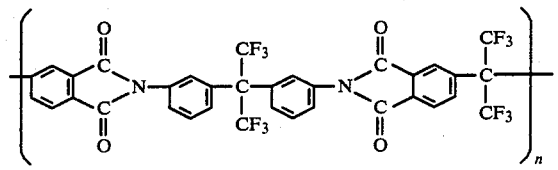

4 Claims, 1 Drawing Figure

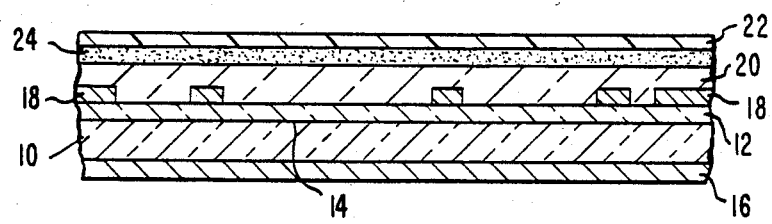

POLYIMIDE COMPOSITION AND METHOD FOR PROTECTING PHOTOREACTIVE CELLS

This is a division of application Ser. No. 451,137, filed Dec. 20, 1982, now abandoned.

BACKGROUND OF THE INVENTION

1. Field of the Invention

This invention relates to a polymeric coating for solar cells and to a polymer coated solar cell, and is particularly directed to polyimide coatings for solar cells and solar cells coated with such polyimides and which coatings are colorless and transparent, relatively non-brittle, have good thermal properties, resistance to ultraviolet radiation degradation, effective in repelling low energy protons and also have other desirable characteristics for use in outer space.

2. Description of the Prior Art

Polymeric coatings for solar cells are required to provide a high degree of solar radiation protection. Conventional polyimides have the requisite thermal stability, but they are colored, and thus absorb in the visible portion of the solar spectrum which reduces performance and generates heat which promotes degradation. Other polymers discolor excessively or lose structural integrity for various other reasons, such as instability to solar protons, electrons, or ultraviolet radiation. When these polymer coatings discolor, the portion of solar spectrum transmitted to the solar cells is reduced, thus effectively reducing the solar cell efficiency.

In the prior art, coatings such as polyurethanes, epoxies, polyesters, polyimides, etc., were evaluated and found to have inadequate stability for various reasons. Perfluorinated aliphatic hydrocarbons, such as FEP Teflon (tetrafluoroethylene hexafluoropropylene copolymer), had a better potential, but had inadequate stability. Further, it is necesssry to employ an adhesive or a fusion process in order to apply the Teflon or other polymer coating to the solar cell itself. Usually such an adhesive is a silicone. However, after a period of time, the adhesive or fusion boundary fails and the Teflon becomes separated from the solar cell, thereby accelerating deterioration and failure of the cell.

Because of the limitations of known polymers heretofore used or considered for solar cells, and particularly for solar cells positioned in outer space, it was necessary to employ a quartz cover over the solar cell itself, in order to protect the cell against low energy particles such as low energy proton bombardment. However, the quartz layer was usually quite heavy (relative to a polymeric coating). This quartz layer thus increased the overall weight and made introduction of the solar cell into very large arrays much more difficult and costly.

Some of the commonly used protective covers for solar cells are formed of fused silica. These fused silica layers usually require a multi-layer filter to effectively filter out all ultraviolet radiation, as for example, that radiation less than 0.35 $\mu$m, to protect the adhesive (e.g., a silicone adhesive) from darkening and losing transmission and hence power. Another protective cover commonly used is Ceria, namely a cerium oxide doped glass micro-sheet. This glass sheet has a natural cut-on frequency of about 0.35 $\mu$m and hence does not require a multi-layer filter for adhesive protection. The Ceria glass sheet does provide for radiation stability.

In addition to the foregoing, a fused silica without a multi-layer filter has been used with the FEP Teflon as the adhesive. This combination is quite effective in view of the fact that glass processing is minimized. However, the overall covered solar cell is still too heavy for use as a space cell in extremely large solar cell arrays.

The method of protecting solar cells which is currently used to a large degree involves the adhesive bonding of a thin $ZnO/Ta_2O_5$ coated quartz coverslide onto the solar cells with a silicone adhesive. The multi-layer $ZnO/Ta_2O_5$ coating on the quartz is a solar radiation cut-off coating which provides damaging solar radiation (approximately less than 0.32 $\mu$m) from penetrating through the quartz into the silicone adhesive. Although this means of protecting solar cells is effective, it is too expensive and impractical to apply to massive solar arrays, such as those which would be required for capturing solar radiation on a massive scale in space and transmitting it to earth. This technique is practical only for relatively "small" devices such as communication satellites where the added costs can be tolerated. It is not practical for large size applications, e.g., acre size applications.

Consequently, there still exists a need for a much more reliable, light weight, protective coating for solar cells, and particularly for those solar cells which are to be exposed to outer space environments. The prior art cover materials or coating materials such as quartz and the other polymers, are of limited effectiveness. The polymer systems, particularly, suffer from the disadvantge in that they exhibit loss of transmission, cracking and loss of adhesion to the cell after exposure to solar ultraviolet radiation for any reasonable period of time. Further, adhesion is affected materially after subjection to the outer space environments. Consequently, the critical properties for solar cell coatings include the property of being resistant to ultraviolet radiation and maintaining optical clarity, even after a period of time. These coatings must also be resistant to degradation by low energy protons and exhibit good adhesion to the cell after some thermal cycling. Further, they must be formulated for ease of application to the solar cells without any damage to the cell itself. In addition, the coatings must be formulated to be more cost effective than the previously and presently used quartz and glass systems.

U.S. Pat. No. 3,356,648 discloses linear polyimides derived from the hexafluoroisopropylidene bridged diamine, such as dianiline, and tetracarboxylic dianhydride. These polyimides are useful as shaped structures and for wrappings, packaging and the like.

U.S. Pat. No. 3,959,350 discloses linear polyimides similar to those of U.S. Pat. No. 3,356,648, but which do not have hexafluoroisopropylidene groups bridging the amine moieties. These polyimides are useful as molding compounds, and for preparing self-supporting film structures and composites. However, these polyimides are not colorless. The lack of transparency and the other physical characteristics, such as processability of these ppolyimides, render them ineffective as solar cell coatings.

SUMMARY OF THE INVENTION

According to the invention, solar cells are coated with a polymer in the form of a polyimide to form a protective coating thereon. The coating is a polyimide which has the following specific properties. The polyimide (1) is colorless, (2) is transparent to the solar radiation in the visible light spectrum, (3) is relatively nonbrittle, (4) has a high degree of thermal stability, (5) readily transmits solar radiation without appreciable degradation, (6) is heat resistant, (7) does not degrade significantly when exposed to ultraviolet radiation, and (8) is highly effective in protecting against low energy particles, such as proton particles, by effectively absorbing such particles.

In a more preferred embodiment, the coating is formed from a polyimide composition which has the recurring structural unit shown below:

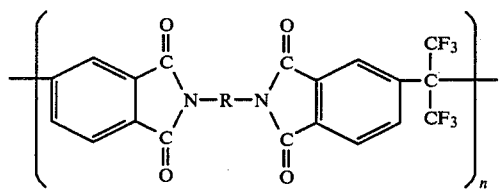

I where R is:

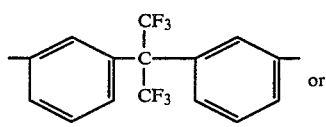 or

II

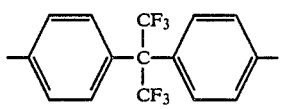

III and n has a value range from 10 to about 2000. Preferably, n has a value from about 10 to about 1000.

The polyimide which is most preferred according to the invention is the meta amino phenylene derivative of formula II above, and having the recurring structural unit:

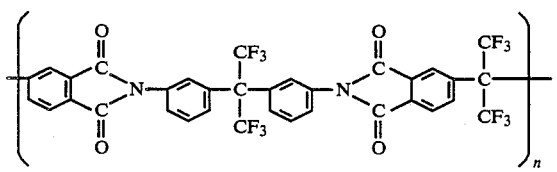

IV and its precursor has the polyamic acid structure:

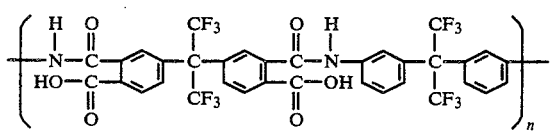

V where n has the values noted above.

It has been found that the above polyimide, particularly of structure IV above, when applied as a coating to a solar cell has excellent resistance to degradation from solar radiation and particularly radiation in the ultraviolet wave length range. The film also has remarkable proton absorption capabilities. It has been noted that no other polymer coatings evaluated to date provide the degree of solar radiation protection afforded by the polyimide coatings of the structure of formula I above, and especially of formula IV while providing the advantage of these coatings.

More particularly, the above polyimide coating is highly suitable for solar cell coating application because of its unique combination of properties. This unique combination of properties includes their excellent thermal stability, which is at least equivalent to that of other aromatic polyimides, transparency in films, colorless nature, stability to ultraviolet radiation, and ability to protect against low energy proton and electron bombardment. This combination of properties is essential for a coating to be useful in the protecting of solar cells.

A particular advantage of the solar cell coatings of this invention is their capability for use without the quartz cover heretofore employed on solar cells and without the need for an adhesive layer susceptible to ultraviolet light degradation.

This invention possesses many other advantages and has other purposes which may be made more clearly apparent from a consideration of the forms and compositions in which it may be embodied. They will now be described in detail for the purposes of more fully setting forth the general principles of the invention, but it is to be understood that such detailed description is not to be taken in a limiting sense.

BRIEF DESCRIPTION OF THE DRAWING

In the accompanying drawing, the FIGURE is a vertical section view of a solar cell having a coating in accordance with the present invention applied thereto.

DETAILED DESCRIPTION OF THE INVENTION

Referring now in more detail and by reference characters to the drawing, there is shown a solar cell having a polyimide coating as hereinafter described. The photocell itself generally comprises a base of p-type semiconductor material which constitutes a p-layer 10 and which is doped on one surface with an n-type material forming an n-layer 12 having a p-n junction 14 therebetween.

A p-layer electrode 16 is attached to the bottom side of the p-layer 10 for an electrical conductor to be connected thereto. An n-layer electrode 18 may be connected to the n-layer 12 to enable an electrical conductor to be connected thereto. The n-layer electrode usually includes a number of so-called relatively thin fingers extending throughout the surface area of the n-layer so as to avoid any substantial interference with visual light radiation impingement on the photocell.

The photoreactive layers or so-called "photo-voltaic" layers including the n-layer 12 and p-layer 10 and junction 14 may adopt the form of a silicon material or it may be a III-V compound such as gallium arsenide, gallium arsenide-phosphide, etc. Other photo-voltaic materials well known in the art may be employed and may be properly doped.

In maby cases, an anti-reflective coating 20 may be employed and would be deposited directly on the active surface of the cell prior to application of the polyimide protective coating. A suitable anti-reflective coating is a combination of $TiO_x$ and $Al_2O_3$, $Ta_2O_5$ or $SiO_x$.

Prior to the application of a polyimide coating 22 prepared in accordance with the present invention, a primer coating 24 may be applied to the upper surface of the n-layer 12 or to the anti-reflective coating 20, if employed. The primer coating 24 would generally increase the adhesion of the polyimide coating to the solar cell and particularly to the upper surface of the anti-reflective layer 20 thereof. A typical primer for this purpose is a silane adhesion promoter, such as aminopropyltrimethoxysilane. Other silane adhesion promoters are also known in the art and might also be used for this purpose.

The polyimide of formula IV above is prepared by the reaction of substantially equal molar proportions of the two monomers 2,2-bis(3-aminophenyl)hexafluoropropane and 4,4'-hexafluoroisopropylidene[bis(phthalic anhydride)], in a solvent for such monomers. The solvents which can be used include, for example, tetrahydrofuran, N-methyl pyrrolidinone, N-methylformamide, dimethylformamide and N,N-dimethylacetamide and mixtures thereof. The resulting polyamic acid solution can be cast as a film and the film imidized to the polyimide structure IV above. Both the polyamic acid and the polyimide have an inherent viscosity of at least 0.1, usually 0.3–0.5. The inherent viscosity of the polyimide is measured at 30° C. as a 0.5% solution in a suitable solvent, such as cold concentrated (96%) sulfuric acid, or methanesulfonic acid.

As noted above, in preparing the coated solar cells according to the invention, a solution of the polyamic acid precursor of formula V above in a solvent, such as tetrahydrofuran, at a concentration of about 10 to about 30% of the polyamic acid, can be used as a varnish for application to the active surface of a solar cell.

The varnish or solution of the polyamic acid precursor can be coated over the primer coating 24 of the solar cell in any suitable manner, for example, by dipping, electrocoating, spraying, electrostatic spraying and the like. Spraying is a convenient method of application, as contrasted, for example, to the use of Teflon applied as a solar coating according to the prior art, and which requires application of a film. A 15% solids content solution of the polymer in N-methylpyrrolidinone or dimethylformamide has been found to be effective. The solution is sprayed after applying the primer (A1100, aminopropyltrimethoxysilane) from a 5% solution in ethanol. The amount of the polyamic acid in the solvent will vary depending primarily on the type of sprayer or other coating means which is used. The solid content of the polyamic acid in the solvent solution can vary greatly and could be as high as 30% in tetrahydrofuran and in which solution dimethylformamide can be present, in an amount of normally at least 60%.

After application of the polyamic acid varnish to the solar cell, that is, over the primer, the solvent is essentially evaporated off and the amic acid polymer is converted into the imidized or polyimide structure of formula IV by heating such amic acid polymer at about 250° C. Lower temperatures, such as at 120° C., can also be used to promote the imidization, but the reaction rate is slower and the elimination of solvent residues is slower. Preferred imidization temperatures range between about 160° C. and 250° C. The polyimide coating may also be dried at 350° F. (about 175° C.) in a vacuum bag. Thinner coatings (about 0.1 mil thick) can be dried and then cured for 1 to 2 hr. at 485° F. (about 250° C.) in a vacuum bag. However, the preferred temperature for effecting imidization is that which provides the best solar cell performance, and this may vary depending upon the specific type of cell and the specific batch of amic acid polymer available.

The polyimide film 22 thus formed is generally a very thin layer, as is the silane primer film. The polyimide film itself is preferably about 0.2 to 0.5 mil thick. However, the practical minimum thickness is about 0.1 mil. There is no absolute maximum thickness, except that the film should be as thin as possible and yet provide the desired characteristics to minimize weight of the solar cell.

EXAMPLES

The invention is further illustrated by, but not limited to, the following examples:

EXAMPLE I

This example I discloses the preparatition of the polyimide and its casting into a film.

A 100 ml three-necked flask was fitted with a stirrer and gas inlet and outlet tubes. The flask was charged with a solution of 2,2-bis(3aminophenyl)hexafluoropropane. (1.6344 grams, 0.004890 mole) in 30 ml of purified N,N-dimethylacetamide. Under an argon atmosphere at room temperature and with good stirring, powdered solid 4,4'-hexafluoroisopropylidenebis(phthalic anhydride) (2.1700 grams, 0.004890 mole) was added over a three minute period. The solution was stirred overnight under argon. The solution increased in viscosity during this time. A clear colorless film could be cast from the solution and after drying at 75° C. in an air circulating oven, the film could be imidized by heating above 200° C. to form a clear and colorless film after imidization.

EXAMPLE II

A solution of varnish of about 15% of the polyamic acid precursor of formula V above in 25% tetrahydrofuran, and containing about 60% of dimethylformamide was prepared in a manner as essentially disclosed in Example I above. The varnish was applied by spraying over the silica covers of a K6¾ solar cell, where K6¾ designates a shallow diffused 10 ohm-cm silicon solar cell with a back surface field and reflector.

After application of the amic acid coating to the solar cell, the coating was heated at about 250° C. for a period of about 60 minutes, causing substantially all of the solvent to evaporate off, and converting the polyamic acid to a colorless transparent film of the polyimide of structure IV above. A 0.5 mil thick colorless transparent polyimide coating was thus formed on the solar cell.

In a 1200 hour test of the 0.5 mil polyimide coating of the type specified above, under a Xenon light source equivalent to 1.5 suns of UV exposure, the net loss in short circuit ($I_{sc}$) corresponding to UV transmittance loss, showed an estimated net UV loss ($I_{sc}$) of only 8.1%, and with a 0.2 mil polyimide coating, ws only 8.4%. This loss was an order of magnitude less than that which has been observed with other polymeric coatings such as polyurethanes, epoxies or polyesters, indicating only very minor degradation of the polyimide coating due to UV exposure as compared to other polymeric coatings.

EXAMPLE III

Thermal cycling of the polyimide coated solar cells (0.2 and 0.5 mil coating) for Example II (room temperature to liquid nitrogen, 25 cycles) showed no loss of adhesion, via a tape pull test, of the coating to the cell substrate. The tape pull test involves the application of an adhesive tape, such as a Scotch Brand number 600 tape or the equivalent, to the solar cell and particularly the n-layer electrode and the p-layer electrode surfaces. The tape is pulled away from these contacts or electrodes with a continuous pull. The pull is initiated at one end and progresses toward the other. The cell is then examined for conformance to a desired adhesion level.

Exposure of the coated cells (0.2 mil and 0.5 mil coating) to simulated space radiation showed essentially no loss in short circuit current. Dosages of $1 \times 10^{11}$ protons/cm$^2$ (50 KeV) and $2 \times 10^{11}$ protons/cm$^2$ (50 KeV) gave identical results. Spectral response was measured before and after proton exposure. No significant changes were noted, thus indicating resistance of the polyimide solar cell coatings to proton radiation.

Several additional tests were conducted with the standard 10 ohm-cm shallow diffused silicon solar cells designated as the K6 solar cells. These cells had a back surface field and a back surface reflector. In some cases, tests were conducted with solar cells having a textured front surface designated as the K-7 cells. Tests were generally conducted with thicknesses of the polyimide films of about 0.2 and 0.5 mil. Further, the thickness variation of the polyimide layer did not apparently have any significant influence on the amount of ultraviolet degradation. Consequently, relatively thin films can be employed.

From the foregoing, it is seen that the invention provides an improved polymer coated solar cell with a specific polyimide coating having the following advantages: a colorless polymeric coating is provided which readily transmits solar energy, does not degrade significantly when exposed to proton radiation, electron radiation and ultraviolet light; is transparent and heat resistant, and protects the solar cell from the damaging effects of solar protons, electrons, ultraviolet light and other forms of radiation, is a relatively non-brittle film forming coating, and has processing characteristics which permit it to be readily coated onto solar cells.

The specific polyimide coatings of the present invention obviate the problems heretofore described. These coatings are very light in weight due to the fact that they can be applied in very thin coatings and nevertheless still provide the necessary protection. For example, a 0.2 mil coating has been found to be highly effective. Further, the low molecular weight of the polymers may provide for good adhesion to the solar cell itself. In addition, this also enables the adhesion to be maintained over a long lifetime. Indeed, exposure of the solar cells coated with the polyimide resin of the invention with a thickness of 0.2 mil to 0.5 mil and subjected to simulated space radiation showed essentially no loss in short circuit current. Spectral response was also measured before and after exposure to low energy protons. Once again, no significant changes were noted and the polyimide coated solar cell permitted effective transmission of solar radiation in the range of 0.32 μm to 0.96 μm.

Thus, there has been described a novel polyimide composition and method for protecting photoreactive cells, such as solar cells, and which composition and method provides a coating which is relatively durable, tightly adherent and capable of withstanding ultraviolet radiation degradation and bombardment by low energy particles. This composition and method thereby fulfills all of the objects and advantages sought therefor. It should be understood that many changes, modifications, variations and other uses and applications will become apparent to those skilled in the art after considering this specification and the accompanying drawing. Therefore, any and all such changes, modifications, variations and other uses and applications which become apparent to those skilled in the art after considering this specification are deemed to be covered by the invention which is limited only by the following claims.

What is claimed is:

1. A method for applying a substantially colorless transparent protective heat resistant polymeric coating to a solar cell, said coating transmitting radiation and having high resistance to low energy protons, electron bombardment and resistance to ultraviolet light degradation, which comprises:

(a) applying a solution of polyamic acid to a solar radiation transmitting component of a solar cell, said polyamic acid having the recurring structural unit:

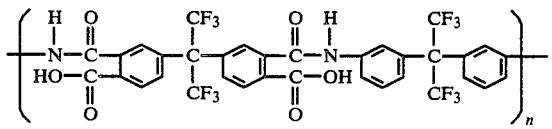

and (b) heating said polyamic acid to convert same to the polyimide in the form of a film having the recurring structural unit:

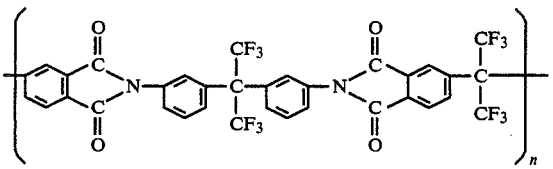

and where n is a number ranging from 10 to about 2000.

2. The method as defined in claim 1, said polyamic acid being formed by reacting equal molar proportions of the two monomers 2,2-bis(3-aminophenyl)hexafluoropropane and 4,4'-hexafluoroisopropylidenebis(phthalic anhydride), in a solvent for such monomers.

3. The method as defined in claim 2, said solution containing a solvent selected from the group consisting of tetrahydrofuran, N-methyl pyrrolidinone, N-methylformamide, dimethylformamide and N,N-dimethylacetamide, and mixtures thereof.

4. An improved method of protecting the photoreactive portion of a photocell by applying a protective coating to said reactive portion, the improvement comprising applying to said photoreactive portion a coating which is substantially colorless and transparent, heat resistant and having high degradation resistance to radiation in the ultraviolet spectrum and resistance to low energy particles, and which coating comprises a polyimide having the recurring structural unit:

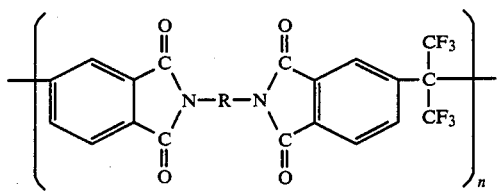
where R is:
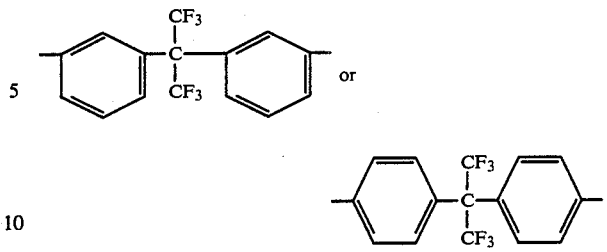
and where n is a number ranging from 10 to about 2000.
* * * * *